United States Patent
Akita et al.

(10) Patent No.: US 6,841,419 B2
(45) Date of Patent: Jan. 11, 2005

(54) METHOD OF FABRICATING A COF UTILIZING A TAPERED IC CHIP AND CHIP MOUNTING HOLE

(75) Inventors: Masanori Akita, Otsu (JP); Toshihiro Mori, Moriyama (JP); Koji Ito, Otsu (JP)

(73) Assignee: Toray Engineering Company, Limited, Osaka (JP)

( * ) Notice: Subject to any disclaimer, the term of this patent is extended or adjusted under 35 U.S.C. 154(b) by 53 days.

(21) Appl. No.: 10/240,673

(22) PCT Filed: Mar. 30, 2001

(86) PCT No.: PCT/JP01/02719

§ 371 (c)(1),
(2), (4) Date: Oct. 3, 2002

(87) PCT Pub. No.: WO01/75789

PCT Pub. Date: Oct. 11, 2001

(65) Prior Publication Data

US 2003/0148555 A1 Aug. 7, 2003

(30) Foreign Application Priority Data

Apr. 4, 2000 (JP) ........................................ 2000-102109

(51) Int. Cl.[7] .............................................. H01L 21/48
(52) U.S. Cl. ...................................... 438/118; 438/125
(58) Field of Search ................................. 438/106, 118, 438/121–127; 257/728, 730, 723, 724, 618, 622, 773

(56) References Cited

U.S. PATENT DOCUMENTS

| | | | | | |
|---|---|---|---|---|---|
| 5,153,700 A | * | 10/1992 | Ohara et al. | ................ | 257/625 |
| 5,208,450 A | * | 5/1993 | Uenishi et al. | ............. | 235/492 |
| 5,783,856 A | * | 7/1998 | Smith et al. | ................ | 257/618 |
| 6,204,555 B1 | * | 3/2001 | Iovdalsky | .................... | 257/728 |
| 6,366,468 B1 | * | 4/2002 | Pan | ............................. | 361/761 |
| 6,528,351 B1 | * | 3/2003 | Nathan et al. | .............. | 438/118 |
| 2003/0057563 A1 | * | 3/2003 | Nathan | ........................ | 257/777 |
| 2003/0059976 A1 | * | 3/2003 | Nathan et al. | .............. | 438/106 |

FOREIGN PATENT DOCUMENTS

| | | | | | |
|---|---|---|---|---|---|
| EP | 1280101 A1 | * | 1/2003 | ......... | G06K/19/077 |
| JP | 62291037 A | * | 12/1987 | .......... | H01L/21/52 |
| JP | 02229454 A | * | 9/1990 | .......... | H01L/23/28 |
| JP | 03-070272 | | 3/1991 | | |
| JP | 04-148999 | | 5/1992 | | |
| JP | 07-117386 | | 5/1995 | | |
| JP | 09-507727 | | 8/1997 | | |

* cited by examiner

*Primary Examiner*—Alonzo Chambliss
(74) *Attorney, Agent, or Firm*—Rader, Fishman & Grauer PLLC

(57) ABSTRACT

A method of manufacturing a COF package comprises the steps of providing a resin film substrate with a hole for receiving a chip, providing an IC chip having electrodes, inserting the IC chip into the hole so as to fix it with its electrodes exposed above the substrate surface, and forming a circuit pattern on the substrate surface for connection with the electrodes. The hole and the IC chip are tapered, and the IC chip is secured in the hole with sealant or adhesive.

12 Claims, 6 Drawing Sheets

US 6,841,419 B2

METHOD OF FABRICATING A COF UTILIZING A TAPERED IC CHIP AND CHIP MOUNTING HOLE

FIELD OF ART

The present invention relates to a method of manufacturing a COF package such as a non-contact type ID card.

BACKGROUND ART

Heretofore, COF (Chip on Film) packages such as a non-contact type ID card and a non-contact type tag have been manufactured by various methods.

As an example there is known a method in which bumps (salient electrodes) formed on an IC chip are aligned with electrodes of an antenna circuit formed on a resin film substrate, then the IC chip is pressed to effect flip chip bonding, and subsequently resin is filled into a slight gap (or a slight space) between the resin film substrate and the IC chip, that is, under-fill is performed.

As another example there is known a method in which a semi-hardened anisotropic conductive film is affixed to electrodes of an antenna circuit formed on a resin film substrate, then bumps (salient electrodes) formed on an IC chip are aligned with the electrodes of the antenna circuit, then the IC chip is pressed under heating to bond the electrodes and harden the anisotropic conductive film.

Thus, in each of these known methods, an IC chip is mounted in a stacked form onto the surface of a substrate having an antenna circuit, and thus a limit is encountered in reducing the package thickness.

In an effort to avoid such an inconvenience, for example as is disclosed in Japanese Published Examined Patent Application No. 70272/1991, there has been proposed a method (hereinafter referred to as the IC chip buried type manufacturing method) in which a resin film substrate having a chip mounting hole and an IC chip having electrodes are provided, then the IC chip is inserted and fixed into the chip mounting hole so as to expose the electrodes above the substrate surface, and thereafter a circuit pattern for connection with the electrodes is formed on the substrate surface.

In this known IC chip buried type manufacturing method, however, since the IC chip is inserted into the chip mounting hole formed in the resin film substrate, it is necessary that the chip mounting hole be formed larger than the IC chip, with consequent formation of a slight gap (or a slight space) between the inserted IC chip and the mounting hole. Therefore, a resin of the same quality as the substrate is filled into the slight gap, followed by hot pressing for fusion-bonding of the two.

In the fusion-bonding, the resin film substrate itself, which is thin, is apt to be deformed and there further arises a problem that the IC chip shifts under a pressing force and its position varies and does not become fixed. Due to this problem, at the time of forming a circuit pattern onto the substrate surface after the insertion and fixing of the IC chip into the chip mounting hole, it is troublesome to form the circuit pattern accurately with respect to the electrodes on the IC chip, that is, in such a state as is free from a larger positional deviation than a predetermined limit, and thus the constant quality cannot be maintained sufficiently.

As one means for solving this problem there has been proposed the adoption of a resin pouring method instead of the aforesaid hot pressing, but the aforesaid means involves complicated manufacturing steps and requires a long processing time. For these reasons it is not suitable for mass production of COF packages and the adoption thereof has so far been difficult.

The present invention has been accomplished in view of such drawbacks and it is a first object of the invention to provide a method of manufacturing a COF package which, when a COF package is to be obtained by the IC chip buried type manufacturing method, permits an IC chip to be buried in such a state as is free from a larger positional deviation than a predetermined limit and which thereby affords a COF package of a constant quality. It is a second object of the present invention to permit mass production of COF packages having a constant quality.

DISCLOSURE OF THE INVENTION

According to the present invention, for achieving the above first object, there is provided a method of manufacturing a COF package, comprising the steps of providing a resin film substrate having a chip mounting hole, providing an IC chip having electrodes, inserting the IC chip into the hole so as to fix it with its electrodes exposed above a surface of the substrate, and forming a circuit pattern on the substrate surface for connection with the electrodes, wherein the chip mounting hole and the IC chip are tapered, and the IC chip is fixed into the chip mounting hole with a sealant or an adhesive.

According to the present invention, for achieving the above second object, the resin film substrate is subjected to pressing with use of a heated tapered die to form the chip mounting hole, or a wafer having conductor patterns is cut with use of a grinding rotary cutter so as to provide tapered cut faces, thereby providing the IC chip having electrodes.

BEST MODE FOR CARRYING OUT THE INVENTION

Figure 1:
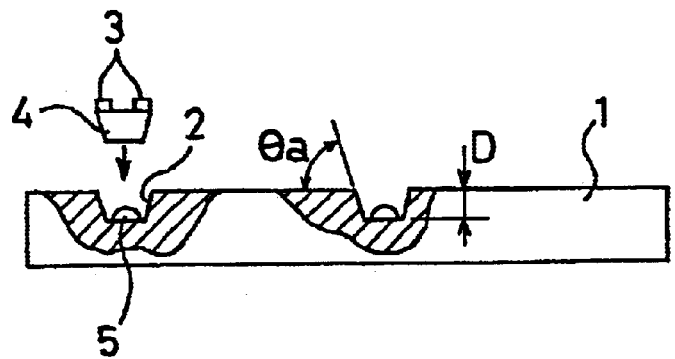
FIG. 1 is a diagram showing a mode in which a tapered IC chip is inserted into a tapered chip mounting hole formed in a resin film substrate.

In the present invention, as shown in FIG. 1, a tapered IC chip 4 having electrodes 3 is inserted into a tapered chip mounting hole 2 formed in a resin film substrate 1 and is fixed with a sealant or adhesive 5 to fabricate a COF package.

The resin film substrate 1 is not specially limited insofar as it is formed of an insulating resin. But a resin substrate suitable for forming the tapered chip mounting hole 2 therein is selected, e.g., a polyester alloy film substrate. Also as to a machining method for forming the hole, a predetermined machining method is selected in relation to the resin film substrate 1 selected. For example, in the case of a polyester alloy film substrate, there is selected a method wherein the substrate is pressed with a heated tapered die. According to this method, the tapered chip mounting hole 2 can be machined rapidly with a certain accuracy.

More specifically, a nickel die having plural projections similar in shape to the tapered IC chip 4 is heated to 240° C. and is pushed against a polyester alloy film substrate, then after pressing for 10 seconds, the die is cooled quickly to 80° C., followed by removal of the die, whereby it is possible to machine a tapered chip mounting hole 2 having a hole pitch of 10 mm long by 10 mm wide, an opening portion of 1.2 mm×1.6 mm, and a depth of 50 $\mu$m.

The tapered chip mounting hole 2 is formed as a non-through hole, but the "non-through hole" as referred to herein may be a non-through hole formed by first forming a through hole in the resin film substrate 1 and by subsequently closing one-end opening of the through hole by a predetermined method. The tapered chip mounting hole 2 is formed in a predetermined shape conforming to the shape of the tapered IC chip 4, but is generally in a square or rectangular shape in plan.

As to the depth D of the tapered chip mounting hole 2, a predetermined depth is selected correspondingly to the thickness of the tapered IC chip 4 having the electrodes 3, i.e., there is selected such a depth as permits the tapered IC chip 4 to be inserted into the chip mounting hole 2 with only the electrodes 3 exposed above the substrate surface. Further, an angle of 45 degrees is generally selected as a taper angle $\theta a$ of the tapered chip mounting hole 2, provided a desired angle can be selected in the range of 45° to 60° as necessary. Also as to a machining pattern, a predetermined pattern is selected as necessary.

Figure 2:
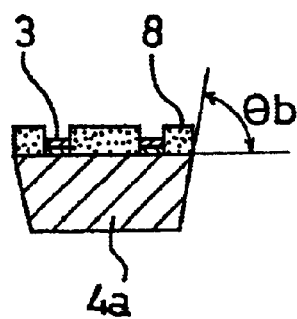
FIG. 2 is a diagram showing a tapered IC chip obtained by cutting a wafer shown in FIG. 5.

On the other hand, a taper angle $\theta b$ (see FIGS. 2 and 3) of the tapered IC chip 4 having the electrodes 3 is set equal to that ($\theta a$) of the tapered chip mounting hole 2, but the tapered IC chip 4 may be manufactured by any method.

Figure 4:
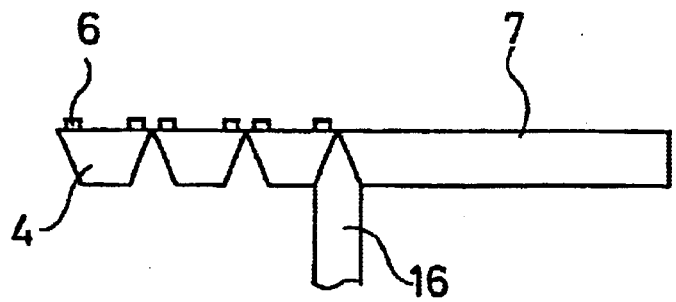
FIG. 4 is a diagram showing a mode in which a wafer is cut into a chip size.

For example, the tapered IC chip 4 may be fabricated in such a manner as shown in FIG. 4, in which a wafer 7 having conductor patterns 6 for forming the electrodes of IC chips is cut into a chip size so as to provide tapered cut faces. As an example of means for the cutting there is mentioned a grinding rotary cutter 16 having a disc shape. There may be adopted any other type of cutting means, but the cutting method just mentioned above is suitable for mass production of the tapered IC chip 4 having the electrodes 3.

Figure 5:
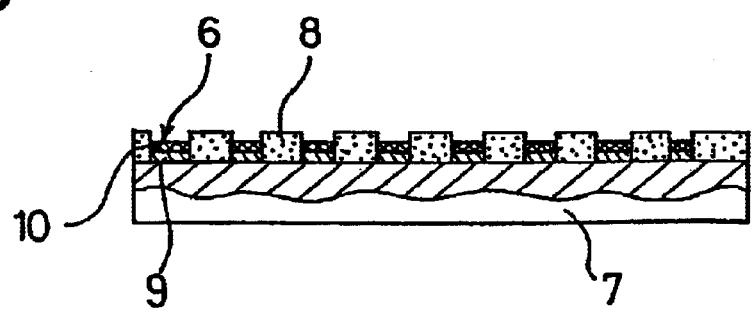
FIG. 5 is a diagram showing an example of a wafer for fabricating a tapered IC chip.
Figure 6:
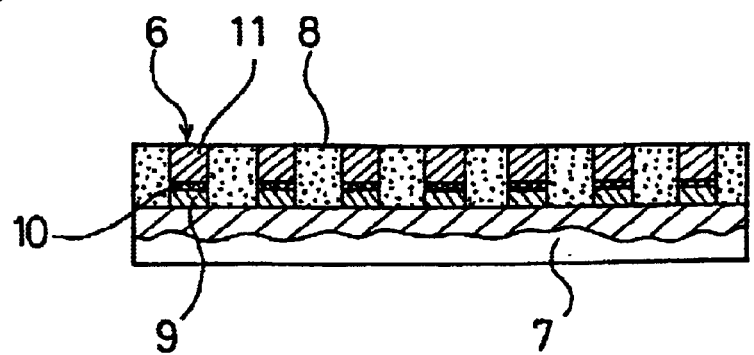
FIG. 6 is a diagram showing another example of a wafer for fabricating a tapered IC chip.
Figure 7:
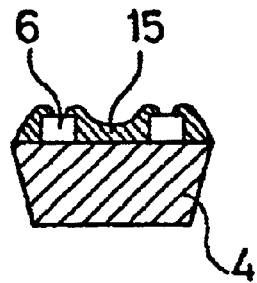
FIG. 7 is a diagram showing a mode in which a passivation film is formed.

The tapered IC chip 4 is formed in a square or rectangular shape in plan and all of its four side faces are tapered at the taper angle $\theta b$. As shown in FIGS. 5 and 6, it is preferable that the wafer 7 having conductor patterns 6 be formed with insulating patterns 8 for insulating the conductor patterns 6 through a passivation film. The formation of the insulating patterns 8 at this stage is not always necessary, but in this case it is necessary to form the insulating patterns 8 after the IC chips 4 obtained by cutting the wafer 7 have been fixed to the substrate. As shown in FIG. 7, the aforesaid passivation film corresponds to a passivation film 15 which covers the wafer surface (i.e., chip surface).

Figure 8:
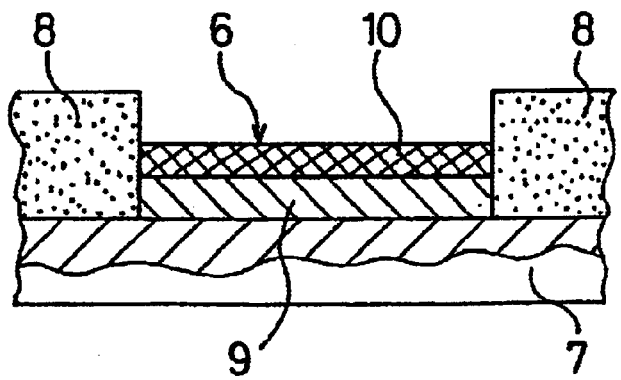
FIG. 8 is a partially enlarged diagram of FIG. 5.
Figure 9:
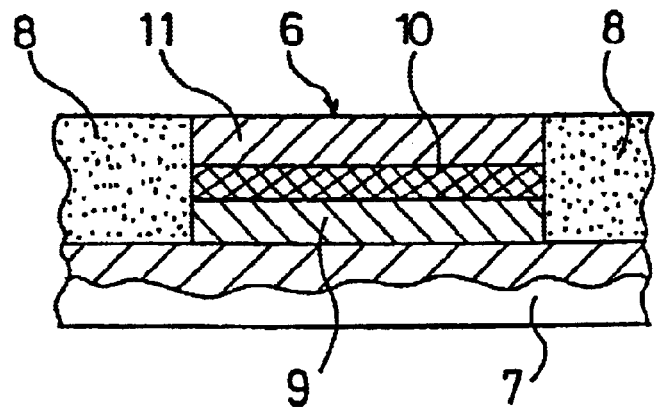
FIG. 9 is a partially enlarged diagram of FIG. 6.

As shown in FIG. 8 which is a partially enlarged view of FIG. 5, the conductor patterns 6 may each have a two-layer structure in which an under-barrier metal layer 10 is formed on an underlying first conductor layer 9 (conductor pattern electrode), or may each have a three-layer structure in which the under-barrier metal layer 10 is formed on the underlying first conductor layer 9 (conductor pattern electrode) and a second conductor layer 11 is formed on the under-barrier metal layer 10, as shown in FIG. 9 which is a partially enlarged view of FIG. 6.

In those structures, the deterioration of the first conductor layer 9 can be prevented by the under-barrier metal layer 10, and the under-barrier metal layer 10 also plays the role of securing the connection between the electrodes of the IC chip and external electrodes. Accordingly, tapered IC chips 4a and 4b (see FIGS. 2 and 3) having electrodes 3 can be obtained by cutting the wafers 7 shown in FIGS. 5 and 6 into a chip size.

It is preferable that the sealant or adhesive 5 be applied in a predetermined amount to the tapered chip mounting hole 2 before inserting the tapered IC chip 4a or 4b having electrodes 3 into the tapered chip mounting hole 2. Where required, the sealant or adhesive 5 may be applied to, for example, a lower end face (a lower surface on the side where the chip is inserted into the tapered chip mounting hole 2) of the tapered IC chip 4 having electrodes 3.

Figure 10:
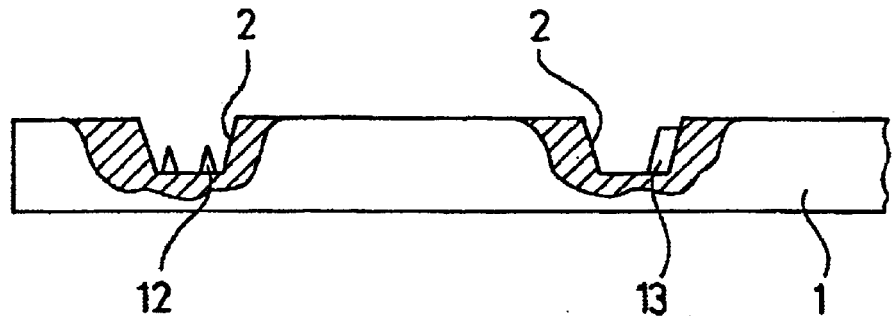
FIG. 10 is a diagram showing a mode in which projections are formed in a tapered chip mounting hole.
Figure 11:
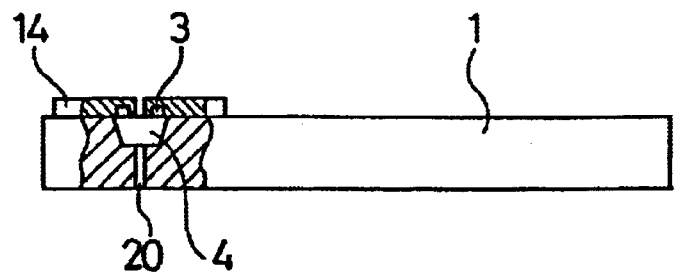
FIG. 11 is a diagram showing a COF package.

To improve rolling of the sealant or adhesive 5, it is preferable that bottom projections 12 or side projections 13 be formed in the tapered chip mounting hole 2, as shown in FIG. 10. Alternatively, it is preferable to form a bleeding hole 20 in the bottom wall of the hole, as shown in FIG. 11. With the bleeding hole 20, it is possible to effect the relief of air at the time of heat-hardening of the sealant or adhesive 5 after insertion of the tapered IC chip 4 into the tapered chip mounting hole 2.

As to the sealant or adhesive 5, a predetermined one can be selected, e.g., an epoxy, acrylic or polyimide-based sealant or adhesive. Generally, it suffices to apply the sealant or adhesive 5 to only the bottom wall of the hole (see FIG. 1). However, the sealant or adhesive 5 may be applied to only the side wall of the hole or both side wall and bottom wall of the hole as necessary. Also as to the application method, there may be used any method, e.g., a method using a transfer pin.

As to the method for inserting the tapered IC chip 4 into the tapered chip mounting hole 2, it is optional whether the method involves inserting all tapered IC chips 4 into plural tapered chip mounting holes 2 respectively at a time or inserting tapered IC chips 4 one by one into the tapered chip mounting holes 2. Generally, the latter is selected because the former involves difficulty. For example, there may be adopted a method wherein tapered IC chips 4 are each chucked by a suction nozzle and transferred, then are inserted one after another into tapered chip mounting holes 2 located at predetermined positions.

Through the above-mentioned steps each tapered IC chip 4 having electrodes 3 is inserted into each tapered chip mounting hole 2 formed in the resin film substrate 1 and both are fixed together by the sealant or adhesive 5. Subsequently, as shown in FIG. 11, a circuit pattern 14 for connection with the electrodes 3 on the tapered IC chip 4 is formed on the resin film substrate 1 by a suitable method such as screen printing and the whole of the substrate surface with the circuit pattern 14 formed thereon is sealed with a resin film or the like.

Thus, in the present invention, the chip mounting hole and IC chip are formed in a tapered shape and the IC chip is fixed to the chip mounting hole with a sealant or adhesive. Therefore, the IC chip can be buried in such a state as is free from a larger positional deviation than a predetermined limit. Consequently, at the time of forming a circuit pattern onto the substrate surface, the circuit pattern can be formed accurately with respect to electrodes of the IC chip, that is, it can be formed so as not to be dislocated to a larger extent than a predetermined limit, thus affording a COF package of a constant quality.

If the sealant or adhesive 5 is applied too much to the tapered chip mounting hole 2, a surplus portion of the sealant or adhesive will be pushed out onto the surface of the resin film substrate when the tapered IC chip 4 is inserted into the hole 2, thus obstructing the formation of the circuit pattern 14 (see FIG. 11). To avoid this inconvenience, it is preferable that the sealant or adhesive 5 be applied to the tapered chip mounting hole 2 locally in a small amount required for fixing the tapered IC chip 4 temporarily, without applying the sealant or adhesive 5 to the whole surface of the tapered chip mounting hole 2.

In this case, however, there is formed a slight gap between the tapered IC chip 4 inserted and temporarily fixed into the tapered chip mounting hole 2 and the same hole, so it is preferable to replenish the sealant or adhesive 5 into the said gap in a vacuum atmosphere.

Figure 12:
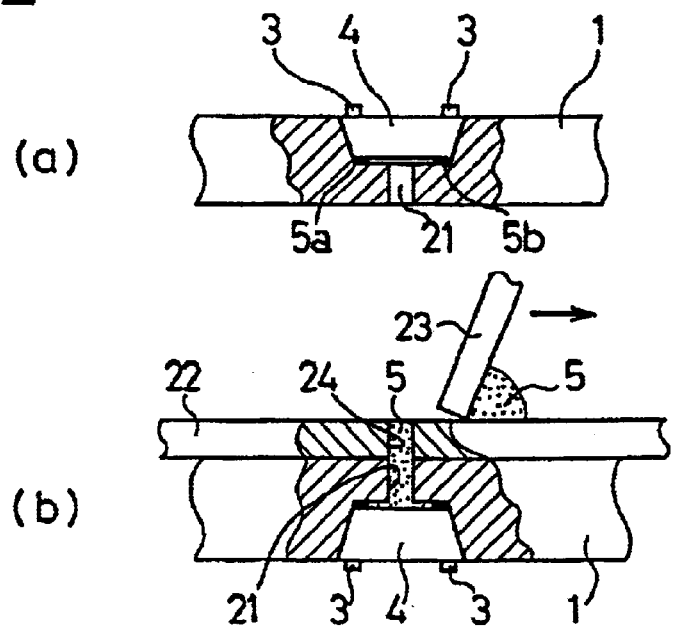
FIG. 12 illustrates a series of steps for replenishing a sealant or an adhesive, in which (a) is a diagram showing a state before replenishment and (b) is a diagram showing a state after replenishment by stencil printing.

For example, in FIG. 12(*a*), the tapered chip mounting hole 2 and the tapered IC chip 4 are contacted with each other at the respective tapered faces and the chip 4 is fixed temporarily at bottom corner portions of the hole 2 by means of sealant or adhesive portions 5*a* and 5*b* which are applied separately from each other to bottom corner portions of the hole 2. In this case, as shown in FIG. 12(*b*), the sealant or adhesive 5 may be replenished by stencil printing in a vacuum atmosphere while utilizing a filling hole 21 formed in the bottom wall of the hole.

In the same figure, with movement of a squeegee 23, the sealant or adhesive 5 fed onto a stencil plate 22 is pushed into the filling hole 21 through an aperture 24 formed in the stencil plate 22 and is filled into the foregoing gap. The filling hole 21 and the bleeding hole 20 may serve in common to each other.

Figure 13:
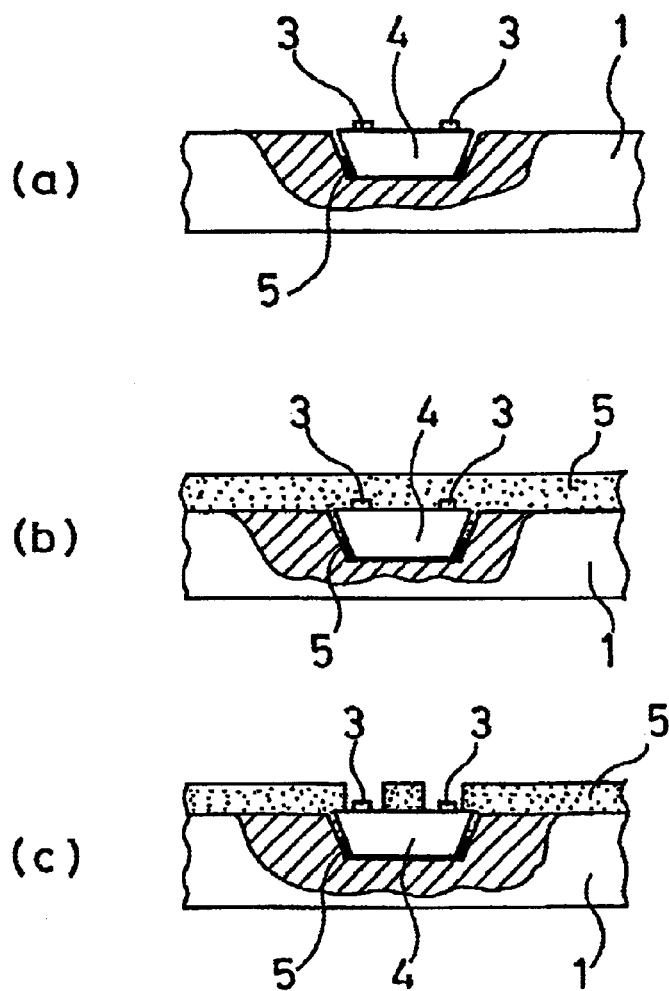
FIG. 13 illustrates another series of steps for replenishing a sealant or an adhesive, in which (a) is a diagram showing a state before replenishment, (b) is a diagram showing a state in which a sealant or an adhesive has been applied onto a resin film substrate, and (c) is a diagram showing a state in which the sealant or adhesive applied onto the resin film substrate has been partially removed, allowing electrodes of a tapered IC chip to be exposed.
Figure 14:
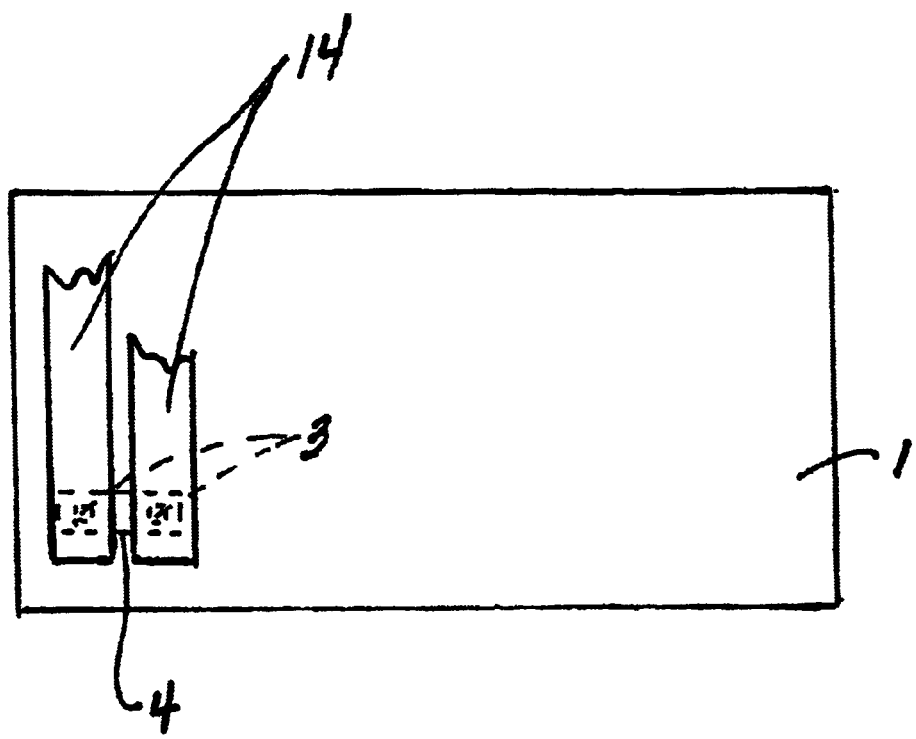
FIG. 14 is a partial top plan view of a circuit pattern on a substrate surface.

In FIG. 13 there is shown another example. In this example, which is different from the above example shown in FIG. 12, the tapered chip mounting hole 2 and the tapered IC chip 4 are not contacted at the respective tapered faces, but the sealant or adhesive 5 is interposed between the two.

In this case, the sealant or adhesive 5 is applied in a vacuum atmosphere onto the surface of the resin film substrate 1 above which the electrodes 3 of the tapered IC chip 4 are exposed, and is thereby filled into the slight gap between the tapered chip mounting hole 2 and the tapered IC chip 4.

Thereafter, in order that the electrodes 3 of the tapered IC chip 4 thus coated with the sealant or adhesive 5 may be exposed, the sealant or adhesive 5 on those electrode portions is removed. In the latter example, it is preferable to use a photosensitive insulating material as the sealant or adhesive 5. But, in case of using such a photosensitive insulating material, the material is removed by development so as to expose the electrodes 3 of the tapered IC chip 4.

In both examples described above, the vacuum atmosphere is held in the range of 13.3 Pa to 665 Pa. Thus, in the present invention, how to apply the sealant or adhesive is not specially limited insofar as the chip mounting hole and the IC chip are tapered.

The processing flow in the IC chip buried type manufacturing method according to the present invention has been outlined above. The manufacturing method will be described below in more detail by way of working Examples.

EXAMPLE 1

A back side of a wafer with aluminum electrodes (a first conductor layer 9 of conductor pattern 6) formed on a surface thereof was polished to obtain a 50 $\mu$m thick wafer 7. The area for each IC chip on the wafer surface was 1.6 mm×2.0 mm and a pair of aluminum electrodes of a square shape with one side being 100 $\mu$m were formed at diagonal positions in an outer periphery portion of the chip area.

The wafer 7 was treated with a weakly acidic solution to remove an oxide film formed on the surface of each aluminum electrode and, after activation treatment, the wafer was immersed in an electroless nickel plating bath at 90° C. for 20 minutes to form a nickel plating layer of about 3 $\mu$m on only each of the aluminum electrodes, then the wafer was immersed in an electroless gold plating bath at 90° C. for 10 minutes to form a gold plating layer of about 0.1 $\mu$m on the nickel plating layer.

The nickel/gold plating layer corresponds to the underbarrier metal layer 10 (generally called UBM) which is for preventing deterioration of the aluminum electrodes and for securing the connection between the IC chip electrodes and external terminals.

Next, using a screen printing machine, a solder resist was printed onto the upper surface of the wafer except the portions where the aluminum electrodes were formed, followed by ultraviolet radiation using a UV lamp, allowing the solder resist to harden to form an insulating pattern 8 having a thickness of 20 $\mu$m.

Then, using the screen printing machine, a conductive paste with silver grains dispersed therein was filled by printing into the aluminum electrode-formed portions (insulating pattern 8—free portions) as open portions and was hardened under heating to form a second conductor layer 11 of each conductor pattern 6 (see FIGS. 6 and 9).

Figure 3:
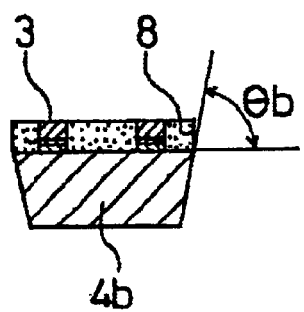
FIG. 3 is a diagram showing a tapered IC chip obtained by cutting a wafer shown in FIG. 6.

Next, the surface (the side where the conductor patterns 6 are formed) of the wafer 7 was affixed to a support film and thereafter the wafer was subjected to full cutting (only the wafer was cut) into a chip size of 1.6 mm×2.0 mm from its back side with use of a diamond blade having a bevel-cut tip to obtain tapered IC chips 4*b* with electrodes 3 formed thereon and having a taper angle θb of 45° (see FIG. 3).

The tapered IC chips 4*b* thus obtained from the wafer were then removed from the support film and arranged in regular order on a pallet fabricated by a nickel electroforming method.

On the other hand, using a nickel die having projecting portions corresponding to the chip shape and each formed in a predetermined pattern, plural tapered chip mounting holes 2 were formed in a resin film substrate 1 constituted by a 100 $\mu$m thick polyester alloy film. More specifically, the nickel die was heated to 240° C. and was pressed under pressure for 10 seconds while pushed against the resin film substrate 1, then was cooled rapidly to 80° C., whereupon it was separated from the substrate.

Tapered chip mounting holes 2 thus formed each had an opening size of 1.6 mm×2.0 mm, a depth D of 70 µm, and a taper angle θa of 45°. The hole pitch was 10 mm longitudinally and 50 mm transversely.

Thereafter, the sealant or adhesive 5, which was constituted by an epoxy resin of a low viscosity, was applied to each tapered chip mounting hole 2 (see FIG. 1). At this time, a very small amount of the sealant or adhesive 5 was applied by transfer using a transfer pin.

Next, each tapered IC chip 4b on the foregoing pallet was chucked by a nozzle having a diameter of 1.5 mm and having a suction hole formed centrally of a nozzle tip, then was transferred and inserted and fixed into the corresponding tapered chip mounting hole 2.

In this way an upper surface (the side where the electrodes 3 are formed) of each tapered IC chip 4b and an upper surface of the resin film substrate 1 could be made contiguous to each other without forming any difference in height between the two; besides, the chip could be inserted and fixed into the hole rapidly.

Thus, the tapered IC chip 4 could be easily mounted on the resin film substrate 1 with only the electrodes 3 exposed above the substrate surface (see FIG. 11). Subsequently, a circuit pattern 14 for connection with the electrodes 3 of the tapered IC chip 4 was formed. More specifically, using a screen printing machine, a conductive paste with silver grains dispersed about 70% therein was printed to form a circuit pattern 14 having a circuit width of 1 mm and a thickness of about 25 µm.

As a result, there could be formed one turn of closed circuit antenna wherein both ends of the circuit pattern 14 were extended onto and conducted with the plural electrodes 3 of the tapered IC chip 4.

Lastly, a cover film constituted by a 100 µm thick polyester alloy film was heat-laminated at 200° C. onto the upper surface of the resin film substrate 1 with the tapered IC chips 4 buried therein, followed by cutting into a card size of 10 mm×50 mm, to afford thin non-contact type tags each having a thickness of about 200 µm.

EXAMPLE 2

A resist was applied onto a 50 µm thick wafer 7 obtained in the same way as in Example 1, followed by drying, and the only aluminum electrode portions (a first conductor layer 9 portion of conductor pattern 6) were exposed to light through a photomask and removed by development, allowing only the aluminum electrodes to be exposed.

Then, the wafer 7 was treated with plasma to remove the oxide film formed on the surface of each aluminum electrode, then TiW and Au were laminated by sputtering in this order to the wafer to thicknesses of about 0.5 µm and 0.05 µm, respectively, and lastly the resist was peeled off. As a result, the laminated metal layer was removed from the other portion than the aluminum electrodes (first conductor layer 9) of each tapered IC chip and an under-barrier metal layer 10 having a total thickness of about 0.55 µm was formed on only each of the aluminum electrodes.

Next, the whole surface of the wafer 7 was coated with a photosensitive epoxy resin, followed by again going through the exposure/development step and heat-hardening step, to form a 15 µm thick insulating pattern 8 on the whole surface of the wafer except the portions where the aluminum electrodes were formed (see FIG. 5).

Then, the wafer was subjected to full cutting (only the wafer was cut) into the chip size in the same way as in Example 1 to obtain tapered IC chips 4a with electrodes 3 formed thereon and having a taper angle θb of 45 degrees.

Subsequently, the tapered IC chips were inserted and fixed into the tapered chip mounting holes 2 in the resin film substrate 1 through the same step as in Example 1. At this time, the upper surface (the side where the electrodes 3 are formed) of each tapered IC chip 4a and that of the resin film substrate 1 could be made contiguous to each other so as not to form a difference in height between the two.

In this way the tapered IC chip 4a could be mounted easily to the resin film substrate 1 with the electrodes 3 exposed above the substrate surface (see FIG. 11).

Subsequently, a circuit pattern 14 for connection with the electrodes 3 was formed on the resin film substrate 1. More specifically, using a screen printing machine, a conductive paste with silver grains dispersed about 70% therein was printed to form a circuit pattern having a thickness of about 30 µm. At the same time, the conductive paste was also printed onto the under-barrier metal layer 10.

Thus, here again there could be formed one turn of closed circuit antenna wherein both ends of the circuit pattern 14 were extended onto and conducted with plural electrodes 3 of each tapered IC chip 4a.

Next, the same cover film as that used in Example 1 was heat-laminated to the upper surface of the resin film substrate 1 at 220° C., followed by cutting into a card size of 10 mm×50 mm, to afford thin non-contact type tags each having a thickness of about 200 µm.

EXAMPLE 3

A wafer 7 with only aluminum electrodes (a first conductor layer 9 of conductor pattern 6) formed on the surface thereof was affixed to a support film, followed by full cutting (only the wafer was cut) into a chip size of 0.6 mm×0.8 mm from the back side with use of a diamond blade having a bevel-cut tip, to afford tapered IC chips 4 each having electrodes 3 and having a taper angle θb of 45 degrees. Each tapered IC chip had sixteen electrodes of a 50 µm square at 100 µm pitches, with no insulating pattern formed thereon.

Then, the tapered IC chips 4 were separated from the support film and arranged in regular order on a pallet fabricated by a nickel electroforming method.

On the other hand, tapered chip mounting holes 2 having a taper angle θa of 45° were formed by a UV laser method in a resin film substrate 1 constituted by a 100 µm thick polyester film and then an epoxy sealant 5 low in viscosity was applied a very small amount to each tapered chip mounting hole 2 with use of a transfer pin. Further, the tapered IC chips 4 were each chucked and transferred by means of a nozzle having a tip diameter of 0.5 mm and having a central suction hole 0.2 mm in diameter and were inserted and fixed into the corresponding tapered chip mounting holes 2.

Also in this case an upper surface (the side where the electrodes 3 are formed) of each tapered IC chip 4 and that of the resin film substrate 1 could be made contiguous to each other so as not to form a difference in height between the two and the insertion and fixing of the chip could be done rapidly.

Next, the whole of the upper surface of the resin film substrate 1 was coated with a photosensitive epoxy resin and a 10 μm thick insulating pattern 8 was formed on the entire wafer surface except the aluminum electrode portions (the first conductor layer 9 portion) through an exposure/development step and a heat-hardening step.

Subsequently, the resin film substrate 1 was treated with an alkaline solution to remove an oxide film formed on the surface of each aluminum electrode, followed by activation treatment, thereafter, the substrate 1 was immersed in an 85° C. electroless nickel plating bath for 15 minutes to form a nickel plating layer of about 2 μm on only the aluminum electrodes, followed by further immersion in an electroless gold plating bath at 90° C. for 5 minutes to form a gold plating layer of 0.05 μm, i.e., an under-barrier layer 10, on the nickel plating layer.

Next, a 0.6 μm thick aluminum film was formed throughout the whole surface of the resin film substrate 1 by sputtering and a resist was applied onto the aluminum film, followed by drying, then a wiring circuit image was formed by exposure and development and thereafter aluminum present in apertures of the resist was removed using an aluminum etching solution to form a circuit pattern 14 of aluminum.

EXAMPLE 4

The same procedure as in Example 3 was repeated up to the step of forming the 10 μm thick insulating pattern 8 on the whole wafer surface except aluminum electrode portions.

Next, the oxide film on the surface of each aluminum electrode was removed by treatment with plasma, then Ni and aluminum were formed into films of 0.05 μm and 0.6 μm respectively by sputtering, thereafter a resist was applied onto the aluminum film and dried, followed by exposure and development to form a wiring circuit image, then the aluminum present in each aperture of the resist was removed using an aluminum etching solution to form a circuit pattern 14 of aluminum.

INDUSTRIAL APPLICABILITY

According to the present invention, as set forth above, when a COF package is to be obtained by the IC chip buried type manufacturing method, each IC chip can be buried so as not to be dislocated to a larger extent than a predetermined limit, so it is possible to form a circuit pattern accurately (so as not to cause a larger positional deviation than a predetermined limit) relative to electrodes of the IC chip and hence possible to obtain a COF package of a constant quality.

Moreover, by pressing a resin film substrate with use of a heated tapered die to form chip mounting holes or by cutting a wafer having conductor patterns with use of a grinding rotary cutter so as to form tapered cut faces, thereby providing IC chips formed with electrodes, it is possible to mass-produce COF packages of a constant quality.

What is claimed is:

1. A method of manufacturing a COF package, comprising the steps of providing a resin film substrate having a chip mounting hole, providing an IC chip having electrodes, inserting said IC chip into said chip mounting hole so as to fix it with its electrodes exposed above a surface of said substrate, and forming a circuit pattern on the substrate surface for connection with said electrodes, wherein said chin mounting hole and said IC chip are tapered, and said IC chip is fixed into said chip mounting hole with a sealant or an adhesive, wherein said sealant or adhesive is replenished in a vacuum atmosphere into a gap formed between said IC chip fixed into said chip mounting hole and said chip mounting hole.

2. The method of claim 1, wherein said IC chip having electrodes is formed by cutting a wafer having conductor patterns into a chip size so as to provide tapered cut faces.

3. The method of claim 2, wherein said wafer is cut with use of a grinding rotary cutter so as to provide said tapered cut faces.

4. The method of claim 3, wherein said chip mounting hole and said IC chip are tapered at the same taper angle.

5. The method of claim 4, wherein each conductor pattern is formed on said IC chip and includes an under-barrier metal layer.

6. The method of claim 5, wherein insulating patterns are formed on said IC chip and in contact with said electrodes for insulating said conductor patterns.

7. A method of manufacturing a COF package, comprising the steps of providing a resin film substrate having a chip mounting hole, providing an IC chip having electrodes, inserting said IC chip into said chip mounting hole so as to fix it with its electrodes exposed above a surface of said substrate, and forming a circuit pattern on the substrate surface for connection with said electrodes, wherein said chip mounting hole and said IC chip are tapered and said IC chin is fixed into said chip mounting hole with a sealant or an adhesive, wherein said resin film substrate is pressed with a heated tapered die to form said chip mounting hole.

8. The method of claim 7, wherein said IC chip having electrodes is formed by cutting a wafer having conductor patterns into a chip size so as to provide tapered cut faces.

9. The method of claim 8, wherein said wafer is cut with use of a grinding rotary cutter so as to provide said tapered cut faces.

10. The method of claim 9, wherein said chip mounting hole and said IC chip are tapered at the same taper angle.

11. The method of claim 10, wherein each conductor pattern is formed on said IC chip and includes an under-barrier metal layer.

12. The method of claim 11, wherein insulating patterns are formed on said IC chip and in contact with said electrodes for insulating said conductor patterns.

* * * * *